(12) United States Patent
Mori et al.

(10) Patent No.: US 10,273,386 B2
(45) Date of Patent: Apr. 30, 2019

(54) THERMOSETTING ADHESIVE SHEET AND SEMICONDUCTOR DEVICE MANUFACTURING METHOD

(71) Applicant: DEXERIALS CORPORATION, Shinagawa-ku, Tokyo (JP)

(72) Inventors: Daichi Mori, Tochigi (JP); Tomoyuki Ishimatsu, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 15/768,197

(22) PCT Filed: Dec. 13, 2016

(86) PCT No.: PCT/JP2016/087089
§ 371 (c)(1),
(2) Date: Apr. 13, 2018

(87) PCT Pub. No.: WO2017/104669
PCT Pub. Date: Jun. 22, 2017

(65) Prior Publication Data
US 2018/0312728 A1    Nov. 1, 2018

(30) Foreign Application Priority Data
Dec. 14, 2015 (JP) ................. 2015-243651

(51) Int. Cl.
*C09J 7/10* (2018.01)
*C09J 7/30* (2018.01)
(Continued)

(52) U.S. Cl.
CPC . *C09J 7/30* (2018.01); *C09J 7/10* (2018.01); *C09J 11/04* (2013.01); *C09J 11/06* (2013.01);
(Continued)

(58) Field of Classification Search
None
See application file for complete search history.

(56) References Cited

U.S. PATENT DOCUMENTS

2003/0226640 A1* 12/2003 Yamazaki ............. H01L 21/561
156/345.1
2010/0272532 A1* 10/2010 Hegedus ................... G09F 3/00
408/117
2017/0114255 A1* 4/2017 Aoki ........................ C09J 11/04

FOREIGN PATENT DOCUMENTS

JP    2002-280329 A    9/2002
JP    2007-273768 A    10/2007
(Continued)

OTHER PUBLICATIONS

Feb. 21, 2017 International Search Report issued in International Patent Application No. PCT/JP2016/087089.

*Primary Examiner* — Thien F Tran
(74) *Attorney, Agent, or Firm* — Oliff PLC

(57) ABSTRACT

Provided are a thermosetting adhesive sheet and a method for manufacturing a semiconductor device capable of reducing semiconductor wafer warping and chipping. The thermosetting adhesive sheet includes a thermosetting adhesive layer containing a resin component and a filler, the resin component containing a (meth)acrylate and a polymerization initiator, the (meth)acrylate containing a solid (meth) acrylate and a trifunctional or higher functional (meth) acrylate, content of the solid (meth)acrylate in the resin component being 55 wt % or more; a total value obtained by multiplying the number of functional groups per unit molecular weight of the (meth)acrylate by content of the (meth)acrylate in the resin component being 2.7E-03 or more, and blending amount of the filler being 80 to 220 pts. mass with respect to 100 pts. mass of the resin component.

13 Claims, 6 Drawing Sheets

(51) Int. Cl.
    *C08K 3/013*          (2018.01)
    *C09J 11/04*          (2006.01)
    *C09J 11/06*          (2006.01)
    *H01L 21/304*        (2006.01)
    *H01L 21/683*        (2006.01)
    *H01L 21/44*          (2006.01)
    *H01L 21/48*          (2006.01)
    *H01L 21/50*          (2006.01)

(52) U.S. Cl.
    CPC ........ *H01L 21/304* (2013.01); *H01L 21/6836* (2013.01); *C08K 3/013* (2018.01); *C09J 2203/326* (2013.01); *C09J 2205/102* (2013.01); *C09J 2433/00* (2013.01)

(56) References Cited

FOREIGN PATENT DOCUMENTS

| | | |
|---|---|---|
| JP | 2008-218930 A | 9/2008 |
| JP | 2010-106244 A | 5/2010 |
| JP | 2011-082368 A | 4/2011 |
| JP | 2015-019012 A | 1/2015 |

\* cited by examiner

THERMOSETTING ADHESIVE SHEET AND SEMICONDUCTOR DEVICE MANUFACTURING METHOD

TECHNICAL FIELD

The present disclosure relates to a thermosetting adhesive sheet for reinforcing a semiconductor wafer and preventing cracks during a dicing process and a method for manufacturing a semiconductor device. This application claims priority to Japanese Patent Application No. 2015-243651 filed on Dec. 14, 2015, the entire contents of which are hereby incorporated by reference.

BACKGROUND ART

In manufacturing processes of semiconductor chips, dicing (separation) processes cause significant stresses in semiconductor wafers. This can cause microcracks in semiconductor wafers and might increase defect rates.

To prevent such problems, applying a thermosetting adhesive sheet immediately before dicing (after backgrinding) to reinforce the semiconductor wafer has been proposed (for example, see PLT 1).

However, thinner semiconductor wafers have increased semiconductor wafer warping, which might impede dicing tape application.

CITATION LIST

Patent Literature

PLT 1: Japanese Unexamined Patent Application Publication No. 2002-280329

SUMMARY OF INVENTION

Technical Problem

In view of such conventional circumstances, an object of the present disclosure is to provide a thermosetting adhesive sheet and a method for manufacturing a semiconductor device capable of reducing semiconductor wafer warping and chipping.

Solution to Problem

In view of the above-described problems, a thermosetting adhesive sheet according to the present disclosure includes a thermosetting adhesive layer formed from a resin composition containing a resin component and a filler, the resin component containing a (meth)acrylate and a polymerization initiator, the (meth)acrylate containing a solid (meth)acrylate and a trifunctional or higher functional (meth)acrylate, content of the solid (meth)acrylate in the resin component being 55 wt % or more, a total value obtained by multiplying the number of functional groups per unit molecular weight of the (meth)acrylate by content of the (meth)acrylate in the resin component being 2.7E-03 or more, and blending amount of the filler being 80 to 220 pts. mass with respect to 100 pts. mass of the resin component.

Furthermore, a method for manufacturing a semiconductor device according to the present disclosure includes a grinding step of grinding a semiconductor wafer, a thermosetting adhesive sheet applying step of applying a thermosetting adhesive sheet to a ground surface of the semiconductor wafer, a curing step of curing the thermosetting adhesive sheet to reduce warping of the semiconductor wafer, a dicing tape applying step of applying a dicing tape to a side of the semiconductor wafer to which the thermosetting adhesive sheet is applied, and a dicing step of dicing the semiconductor wafer to which the dicing tape is applied to obtain individual semiconductor chips, the thermosetting adhesive sheet including a thermosetting adhesive layer formed from a resin composition containing a resin component and a filler, the resin component containing a (meth)acrylate and a polymerization initiator, the (meth)acrylate containing a solid (meth)acrylate and a trifunctional or higher functional (meth)acrylate, content of the solid (meth)acrylate in the resin component being 55 wt % or more, a total value obtained by multiplying the number of functional groups per unit molecular weight of the (meth)acrylate by content of the (meth)acrylate in the resin component being 2.7E-03 or more, and blending amount of the filler being 80 to 220 pts. mass with respect to 100 pts. mass of the resin component.

Advantageous Effects of Invention

According to the present disclosure, semiconductor wafer warping can be reduced by applying the thermosetting sheet to a ground surface of the semiconductor wafer and curing to contract the thermosetting sheet. This enables increased flatness of the wafer during dicing to reduce chipping and achieve a high-quality semiconductor device.

DESCRIPTION OF EMBODIMENTS

Embodiments of the present disclosure will now be described in detail according to the following order.
1. Thermosetting Adhesive Sheet
2. Semiconductor Device Manufacturing Method
3. Examples

1. Thermosetting Adhesive Sheet

A thermosetting adhesive sheet according to this embodiment is a reinforcing sheet having a thermosetting adhesive layer to be applied to a ground surface of a semiconductor wafer when dicing the semiconductor wafer to reinforce the wafer and prevent cracks known as chipping during a dicing process.

Figure 1:
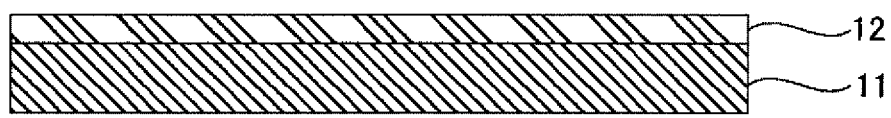
FIG. 1 is a schematic cross-sectional view illustrating a thermosetting adhesive sheet.

FIG. 1 is a schematic cross-sectional view illustrating a thermosetting adhesive sheet. As illustrated in FIG. 1, the thermosetting adhesive sheet includes a matrix film layer 11 and a thermosetting adhesive layer 12 laminated together.

Examples of the matrix film layer 11 include plastic films such as those of polyethylene terephthalate, polyethylene, polypropylene, and polyester, as well as porous matrix materials such as those of paper, cloth, and nonwoven fabric.

The thermosetting adhesive layer 12 is formed from a resin composition containing a resin component and a filler; the resin component contains a (meth)acrylate and a polymerization initiator. It should be noted that, in the present disclosure, (meth)acrylate is meant to include acrylic acid esters (acrylates) and methacrylic acid esters (methacrylates).

As the (meth)acrylate, monofunctional (meth)acrylates, bifunctional (meth)acrylates, and trifunctional or higher (meth)acrylates can be used.

Examples of monofunctional (meth)acrylates include polyalkylene glycol ester monomers and alkyl (meth)acrylates having branched or linear alkyl groups. Examples of polyalkylene glycol ester monomers include hydroxyethyl (meth)acrylate, hydroxypropyl (meth)acrylate, 4-hydroxybutyl acrylate, polyethylene glycol mono(meth)acrylate, polypropylene glycol mono(meth)acrylate, polybutylene glycol mono(meth)acrylate, and polyethylene glycol polypropylene glycol mono(meth)acrylate; these may be used individually or in a combination of two or more.

Examples of bifunctional (meth)acrylates include, tricyclodecane dimethanol di(meth)acrylate dimethylol tricyclodecane (meth)acrylate, bisphenol A EO-modified di(meth)acrylate, 1,9-noanediol di(meth)acrylate, 1,10-decanediol di(meth)acrylate, 2-hydroxy-3-acryloyloxypropyl (meth)acrylate, propoxylated bisphenol A di(meth)acrylate, diethylene glycol di(meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexanediol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate, and isocyanurate EO-modified di(meth)acrylate, among others; these may be used individually or in a combination of two or more. Among these, tricyclodecane dimethanol di(meth)acrylate is preferably used in view of reaction and crosslinking properties, among other considerations. Examples of commercially available bifunctional (meth)acrylates include trade name "A-DCP" (tricyclodecane dimethanol diacrylate) of SHIN-NAKAMURA CHEMICAL CO. LTD.

Examples of trifunctional or higher functional (meth)acrylates include isocyanurate EO-modified tri(meth)acrylate, dipentaerythritol hexa(meth)acrylate, pentaerythritol tri(meth)acrylate, EO-modified pentaerythritol tri(meth)acrylate, ε-caprolactone-modified tris-(-2-acryloxyethyl) isocyanurate, trimethylol propane tri(meth)acrylate, ε-caprolactone-modified tris(acroxyethyl) (meth)acrylate, ethoxylated (20) trimethylolpropane tri(meth)acrylate, propoxylated (3) trimethylolpropane tri(meth)acrylate, propoxylated (6) trimethylolpropane tri(meth)acrylate, ethoxylated (9) trimethylolpropane tri(meth)acrylate, propoxylated (3) glyceryl tri(meth)acrylate, ethoxylated (4) pentaerythritol tetra(meth)acrylate, pentaerythritol tetra(meth)acrylate, ditrimethylolpropane tetra(meth)acrylate, dipentaerythritol penta(meth)acrylate, EO-modified dipentaerythritol penta(meth)acrylate, and urethane (meth)acrylate having three to nine functional groups; these may be used individually or in a combination of two or more. Among these, in view of reaction and crosslinking properties, among other considerations, isocyanurate EO-modified tri(meth)acrylate and dipentaerythritol hexa(meth)acrylate are preferable. Commercial examples of trifunctional or higher functional (meth)acrylate include trade names "M-315" (compound of isocyanurate ethylene-oxide-modified diacrylate and isocyanurate ethylene-oxide-modified triacrylate (3 to 13% isocyanurate ethylene-oxide-modified diacrylate content) available from by TOAGOSEI CO., LTD. as well as "UN-3320HA" (polyfunctional urethane acrylate oligomer) and "UN-6301" (aliphatic urethane acrylate oligomer) available from Negami Chemical Industrial Co., Ltd.

This embodiment uses at least a solid (meth)acrylate and a trifunctional or higher functional (meth)acrylate in the (meth) acrylate to reduce semiconductor wafer warping and chipping. In the present disclosure, a solid (meth)acrylate means a (meth)acrylate that is in a solid state at a normal temperature (25° C.), or in terms of melting point, has a melting point that exceeds 50° C.

Examples of the solid (meth)acrylate include epoxy (meth)acrylates and urethane (meth)acrylates having a high molecular weight as well as crystalline properties; moreover, the solid (meth)acrylate preferably has a melting point that is higher than 50° C. An epoxy (meth)acrylate may be obtained by reacting an epoxy resin and a vinyl group-containing monocarboxylic acid. Examples of epoxy resins include novolac epoxy resins, bisphenol A epoxy resins, and bisphenol F epoxy resins, and examples of vinyl group-containing monocarboxylic acids include (meth)acrylic acid, (meth)acrylic acid dimers, β-furfuryl (meth)acrylic acid, β-styryl (meth)acrylic acid, and cinnamic acid. Among these, bisphenol epoxy (meth)acrylates obtained by reacting a bisphenol A epoxy resin or bisphenol F epoxy resin with a (meth)acrylic acid is preferably used in view of film-formation properties. Commercial examples of solid bisphenol epoxy (meth)acrylates include trade names "VR-90" and "VR-60" available from Showa Highpolymer Co., Ltd.

Moreover, the solid (meth)acrylate has a weight average molecular weight of preferably 500 to 10,000 and more preferably 800 to 3,000. Weight average molecular weights of 500 or more tend to improve film properties and weight average molecular weights of 10,000 or less tend to improve tackiness.

Furthermore, content of the solid (meth)acrylate in the resin component is 55 wt % or more, preferably 60 wt % or more, and more preferably 70 wt % or more. Increased content of the solid (meth)acrylate in the resin component tends to improve control of wafer warping.

(Meth)acrylates having exceedingly large molecular weights relative to number of functional groups tend to exhibit properties similar to those of monofunctional acrylates and degrade wafer warping control despite formally having two or more (meth)acryloyl groups. Accordingly, polyfunctional (meth)acrylates are preferably selected with consideration to "functional groups per unit molecular weight" obtained by dividing number of functional groups by molecular weight.

This embodiment can increase a contraction ratio of the thermosetting adhesive layer to cancel out wafer warping by average crosslink density being set to exceed a predetermined value, the average crosslink density being a total value obtained by multiplying number of functional groups per unit molecular weight by content of the (meth)acrylate in the resin component.

Thus, a total value obtained by multiplying the number of functional groups per unit molecular weight of the (meth)acrylate by content of the (meth)acrylate in the resin component is 2.7E-03 or more. Furthermore, a total value obtained by multiplying the number of functional groups per unit molecular weight of the (meth)acrylate by content of the (meth)acrylate in the resin component preferably has an upper limit of 5.0E-2 or less and more preferably 1.0E-02 or less. Insufficient average crosslink densities impede cancelling out semiconductor wafer warping, and excessive values tend to degrade characteristics such as adherence to the semiconductor wafer.

Furthermore, content of the (meth)acrylate in the resin component is preferably 85 wt % or more and more preferably 90 wt % or more. Insufficient content of the (meth) acrylate in the resin component impedes cancelling semiconductor wafer warping, and excessive content tends to degrade sheet characteristics.

Furthermore, weight average molecular weight of the (meth)acrylate is preferably 100 to 100,000 and more preferably 200 to 50,000. Insufficient or excessive weight average molecular weights tend to degrade wafer warping control.

The polymerization initiator can be an organic peroxide, which is a radical initiator. The organic peroxide has a one-minute half-life temperature of preferably 130° C. or less and more preferably 80 to 120° C. Excessive one-minute half-life temperatures impede fast reaction rates, and insufficient one-minute half-life temperatures tend to degrade normal-temperature storage-stability.

Examples of such organic peroxides include dilauroyl peroxide (one-minute half-life temperature: 116.4° C.), dibenzoyl peroxide (one-minute half-life temperature: 130.0° C.), di(4-methylbenzoyl) peroxide (one-minute half-life temperature: 128.2° C.), 1,1,3,3-tetramethylbutyl peroxy-2-ethylhexanoate (one-minute half-life temperature: 124.3° C.), di(3,5,5-trimethyl hexanoyl) peroxide (one-minute half-life temperature: 112.6° C.), t-butyl peroxypivalate (one-minute half-life temperature: 110.3° C.), t-hexyl peroxypivalate (one-minute half-life temperature: 109.1° C.), t-butyl peroxyneoheptanoate (one-minute half-life temperature: 104.6° C.), t-butyl peroxyneodecanoate (one-minute half-life temperature: 103.5° C.), t-hexyl peroxyneodecanoate (one-minute half-life temperature: 100.9° C.), di(2-ethylhexyl) peroxydicarbonate (one-minute half-life temperature: 90.6° C.), di(4-t-butylcyclohexyl) peroxydicarbonate (one-minute half-life temperature: 92.1° C.), 1,1,3,3-tetramethylbutyl peroxyneodecanoate (one-minute half-life temperature: 92.1° C.), diisobutyryl peroxide (one-minute half-life temperature: 85.1° C.), di-sec-butyl peroxydicarbonate (one-minute half-life temperature: 85.1° C.), di-n-propyl peroxydicarbonate (one-minute half-life temperature: 85.1° C.), and cumyl peroxyneodecanoate (one-minute half-life temperature: 85.1° C.); these may be used individually or in a combination of two or more. Among these, dilauroyl peroxide and 1,1,3,3-tetramethylbutyl peroxy-2-ethylhexanoate are preferably used in view of reaction and crosslinking properties, among other considerations. Examples of commercially available dilauroyl peroxides include trade name "PEROYL L" manufactured by NOF CORPORATION.

Moreover, content of the organic peroxide is preferably 0.1 to 20 pts. mass and more preferably 1 to 10 pts. mass with respect to 80 pts. mass of the (meth)acrylate. Insufficient content of the organic peroxide degrades reaction properties, and excessive content tends to reduce product lifetime.

Furthermore, the resin component may contain a polymer such as an elastomer or a phenoxy resin. Examples of elastomers include acrylic elastomers, butadiene elastomers, ethylene elastomers, propylene elastomers, and styrene elastomers; these may be used individually or in a combination of two or more. Among these, an acrylic elastomer having excellent transparency is preferably used. Examples of commercially available acrylic elastomers include tradename "SG-P3" manufactured by Nagase ChemteX Corporation. Examples of phenoxy resins include fluorene phenoxy resins, bisphenol phenoxy resins, novolac phenoxy resins, naphthalene phenoxy resins, and biphenyl phenoxy resins; these may be used individually or in a combination of two or more.

Furthermore, weight average molecular weight (Mw) of the polymer is preferably 5,000 to 150,000 and more preferably 10,000 to 80,000. Insufficient weight average molecular weights (Mw) tend to degrade sheet characteristics, and excessive weight average molecular weights (Mw) tend to degrade compatibility with other constituents.

Furthermore, content of the polymer in the resin component is preferably 15 wt % or less and more preferably 5 wt % or less. Insufficient or excessive content of the polymer in the resin component tends to degrade sheet characteristics.

Furthermore, it is preferable to add a silane coupling agent to the resin component. As the silane coupling agent, (meth) acrylic-based, epoxy-based, amino-based, mercapto-based, sulfide-based, and ureido-based agents may be used; however, the present embodiment preferably uses a (meth) acrylic silane coupling agent. This can improve adhesion reliability at interfaces between organic and inorganic materials.

The filler may be inorganic or organic and is preferably transparent to infrared light used in alignment. Examples of materials that are transparent to infrared light include silica, silicon, germanium, quartz, and sapphire; these may be used individually or in a combination of two or more. Among these, silica is preferably used in view of laser mark visibility.

Moreover, blending amount of the filler is 80 to 220 pts. mass and preferably 80 to 180 pts. mass with respect to 100 pts. mass of the resin component. Insufficient blending amounts of the filler tend to degrade wafer warping reduction effects, and excessive blending amounts tend to degrade adhesion reliability.

Moreover, a colorant such as a black pigment is preferably added as another filler. The colorant enhances contrast between laser marking portions and other portions to improve laser mark visibility. Examples of such colorants include carbon black, titanium black, titanium oxide, and iron oxide; these may be used individually or in a combination of two or more. Among these, carbon black is preferably used in view of improving contrast.

Moreover, the thermosetting adhesive sheet preferably has a transmittance of 30% or more at a wavelength of 1,000 nm. Insufficient infrared transmittance would impede alignment using infrared.

According to such a thermosetting adhesive sheet, semiconductor wafer warping can be reduced by applying the thermosetting sheet to a ground surface of the semiconductor wafer and curing to contract the thermosetting sheet. This enables increased flatness of the wafer during dicing to reduce chipping and achieve a high-quality semiconductor device.

2. Semiconductor Device Manufacturing Method

Next, a method for manufacturing a semiconductor device using the above-described thermosetting adhesive sheet will be described. A method for manufacturing a semiconductor device according to the present embodiment includes a grinding step of grinding a semiconductor wafer, a step of applying a thermosetting adhesive sheet to a ground surface of the semiconductor wafer and curing the thermosetting adhesive sheet to reduce warping of the semiconductor wafer, and a dicing step of applying a dicing tape to a side of the semiconductor wafer to which the thermosetting adhesive sheet is applied and dicing the semiconductor wafer. Because semiconductor wafer warping can be reduced, the wafer can be diced in a state of increased flatness, thereby reducing chipping and achieving a high-quality semiconductor device.

Hereinafter, an example method for manufacturing a semiconductor device will be described. An example method for manufacturing a semiconductor device includes a protective tape applying step (A) of applying a protective tape having an adhesive agent layer, a grinding step (B), a thermosetting resin sheet applying step (C), a protective tape peeling step (D), a curing step (E), an adhesive tape applying step (F), a dicing step (G), an expanding step (H), a picking-up step (I), and a mounting step (J). It should be noted that the protective tape peeling step (D) may be performed before the thermosetting resin sheet applying step (C).

(A) Protective Tape Applying Step

Figure 2:
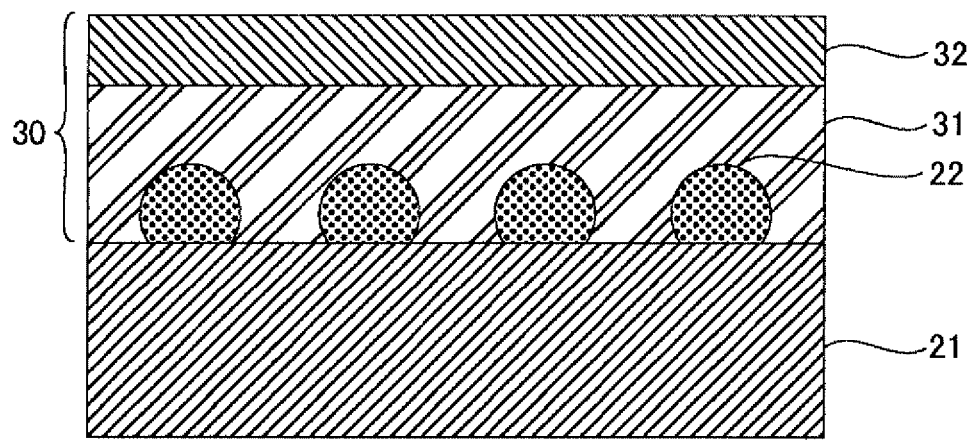
FIG. 2 is a schematic cross-sectional view illustrating a BG tape applying step.

FIG. 2 is a schematic cross-sectional view illustrating a protective tape applying step. The protective tape applying step includes applying a protective tape 30 to a surface of a wafer 21 having a protruding electrode 22 formed thereon. The application temperature for applying the protective tape 30 is preferably 25 to 100° C. and more preferably 40 to 80° C. in view of reducing voids, improving wafer adhesion properties, and preventing warping of the wafer after grinding.

The wafer 21 includes an integrated circuit formed on a surface of a semiconductor such as silicon and the protruding electrode 22, which is known as a bump and used for connecting. Thickness of the wafer 21 is without particular limitation but is preferably 200 to 1,000 μm.

Examples of the protruding electrode 22 include, without particular limitation, solder-containing low-melting point bumps or high-melting point bumps, tin bumps, silver-tin bumps, silver-tin-copper bumps, gold bumps, and copper bumps. Moreover, height of the protruding electrode 22 is without particular limitation but is preferably 10 to 200 μm.

The protective tape 30 is known as backgrind tape and protects the wafer from scratches, cracks, and contamination in the following grinding step (B). As illustrated in FIG. 2, the protective tape 30 has a thermoplastic resin layer 31 and a matrix film layer 32 laminated together and is applied so that the thermoplastic resin layer 31 contacts the surface on which the protruding electrode 22 is formed; the protruding electrode 22 embeds into the thermoplastic resin layer 31.

Examples of the thermoplastic resin layer 31 include ethylene vinyl acetate copolymer (EVA), polyethylene, polypropylene, polyamide, polyacetal, polyethylene terephthalate, polybutylene terephthalate, fluoropolymer, polyphenylene sulfide, polystyrene, ABS resin, acrylic resin, polycarbonate, polyurethane, polyvinyl chloride, and polyphenylene oxide, among others; these may be used individually or in a combination of two or more.

Examples of the matrix film layer 32 include plastic films such as those of polyethylene terephthalate, polyethylene, polypropylene, and polyester, as well as porous matrix materials such as those of paper, cloth, and nonwoven fabric.

It should be noted that the protective tape 30 is not limited to the configuration described above, and other layers may be formed on the surface of any layer or between any adjacent layers.

(B) Grinding Step

Figure 3:
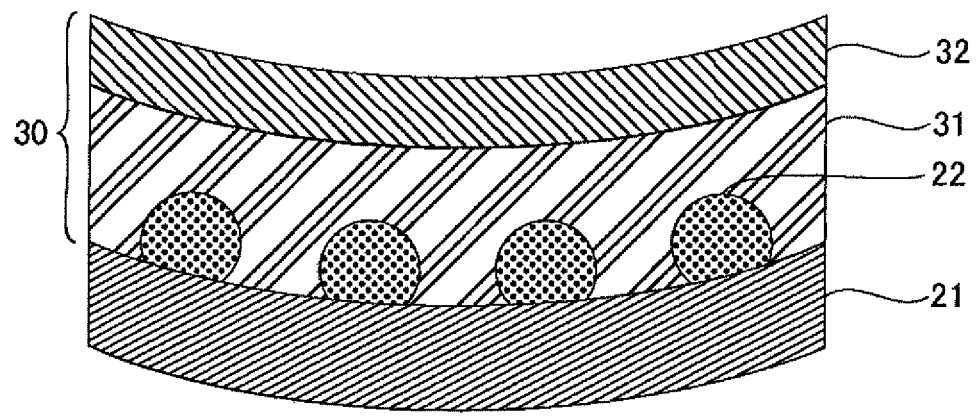
FIG. 3 is a schematic cross-sectional view illustrating a grinding step.

FIG. 3 is a schematic cross-sectional view illustrating a grinding step. The grinding step includes grinding a surface opposite to an application-surface of the protective tape 30. With the protective tape 30 applied on one side, the wafer 21 is secured to a grinding device and ground on the other side. In the grinding step, the wafer 21 is ground to a thickness of 200 μm or less and may be ground to a thickness of 50 μm or less. Decreasing thickness of the wafer 21 increases warping of the wafer 21. It should be noted that warping of the wafer 21 is measured as the maximum value of the warp (z-axis) when the wafer 21 is placed on a planar stage (x-y plane).

(C) Thermosetting Adhesive Sheet Applying Step

Figure 4:
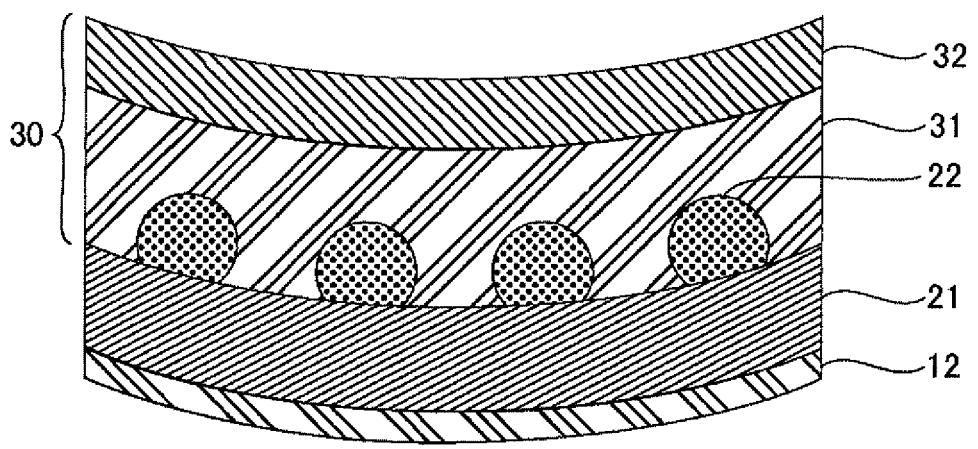
FIG. 4 is a schematic cross-sectional view illustrating a thermosetting adhesive sheet application step.

FIG. 4 is a schematic cross-sectional view illustrating a thermosetting adhesive sheet applying step. The thermosetting adhesive sheet applying step includes applying a thermosetting adhesive layer 12 of the thermosetting adhesive sheet to the ground surface of the wafer 21.

Figure 5:
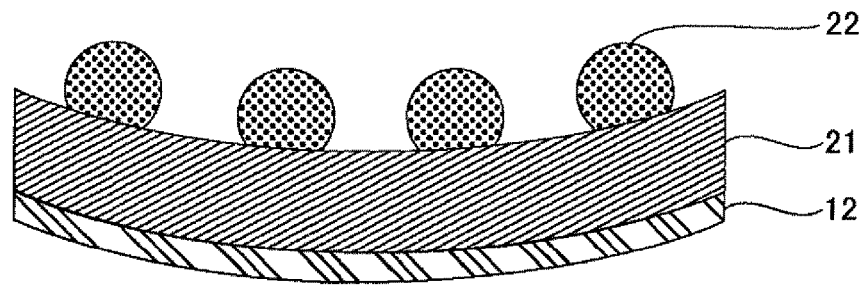
FIG. 5 is a schematic cross-sectional view illustrating a BG tape peeling step.

(D) Protective Tape Peeling Step FIG. 5 is a schematic cross-sectional view illustrating a protective tape peeling step. The protective tape peeling step includes peeling the protective tape 30.

(E) Curing Step

Figure 6:
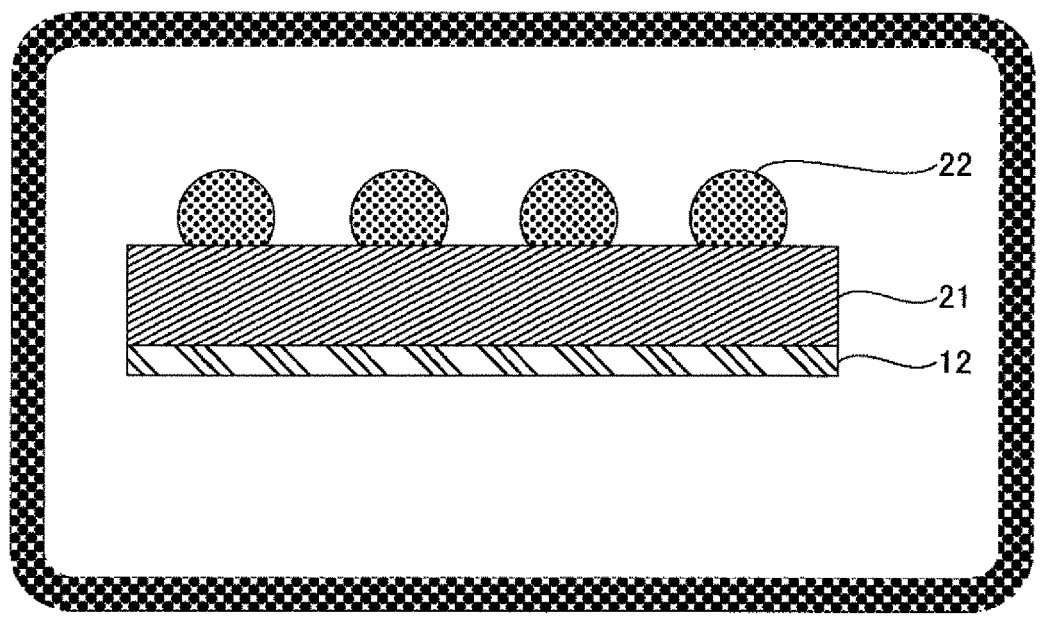
FIG. 6 is a schematic cross-sectional view illustrating a curing step.

FIG. 6 is a schematic cross-sectional view illustrating a curing step. The curing step includes curing the thermosetting adhesive layer 12. As a curing method and conditions, known methods for curing thermosetting adhesive agents may be used. For example, the thermosetting adhesive layer 12 can be cured at a temperature of 80 to 180° C. for 0.1 to 5 hours in the curing step. This significantly contracts the thermosetting adhesive layer 12 and generates stress opposing the warp direction of the wafer 21, which can maintain flatness of the wafer 21.

(F) Adhesive Tape Applying Step

Figure 7:
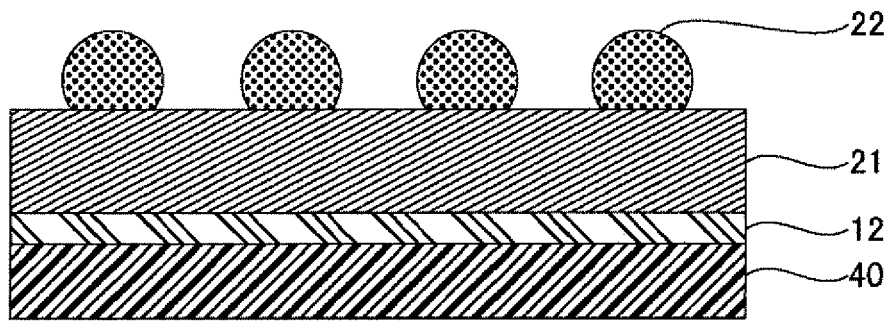
FIG. 7 is a schematic cross-sectional view illustrating a DC tape applying step.

FIG. 7 is a schematic cross-sectional view illustrating an adhesive tape applying step. The adhesive tape applying step includes applying an adhesive tape 40 onto the ground surface. The adhesive tape 40, known as dicing tape, protects and secures the wafer 21 from the dicing step (G) through the picking-up step (I).

The adhesive tape 40 is without particular limitation and known adhesive tapes may be used. Typically, the adhesive tape 40 has an adhesive layer and a matrix film layer. Examples of the adhesive layer include polyethylene-based, acrylic-based, rubber-based, and urethane-based adhesives. Moreover, examples of the matrix film layer include plastic films such as those of polyethylene terephthalate, polyethylene, polypropylene, and polyester, as well as porous matrix materials such as those of paper, cloth, and nonwoven fabric. The application device as well as conditions for applying the adhesive tape are without particular limitations, and well-known devices and conditions may be employed.

(G) Dicing Step

Figure 8:
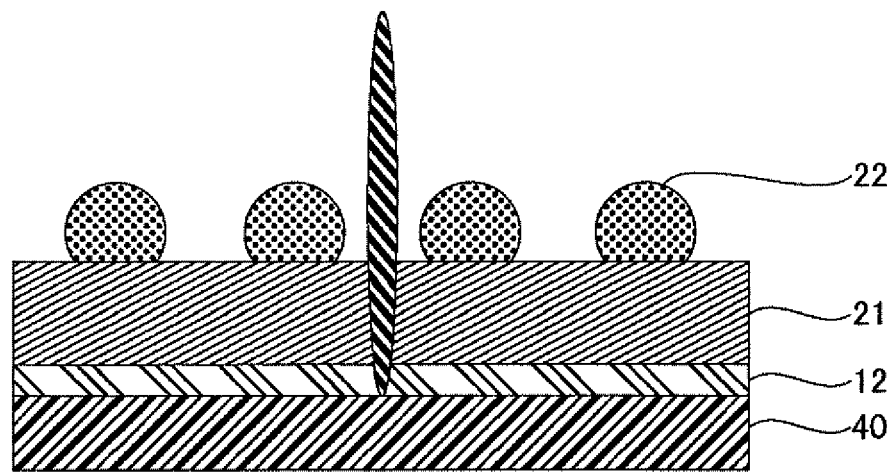
FIG. 8 is a schematic cross-sectional view illustrating a dicing step.

FIG. 8 is a schematic cross-sectional view illustrating a dicing step. The dicing step includes dicing the wafer 21, having the adhesive tape 40 applied thereon, to obtain individual semiconductor chips. The dicing method is without particular limitation, and known methods such as, for example, cutting the wafer 21 apart with a dicing saw may be employed. Because the thermosetting adhesive sheet reduces wafer warping, the wafer can be diced in a state of increased flatness and chipping can be reduced.

(H) Expanding Step

Figure 9:
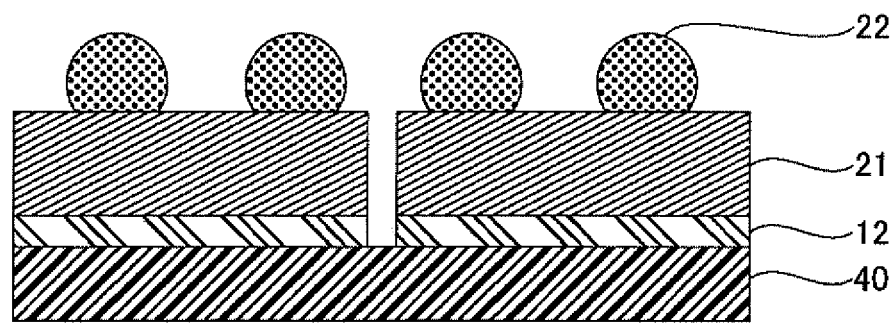
FIG. 9 is a schematic cross-sectional view illustrating an expanding step.

FIG. 9 is a schematic cross-sectional view illustrating an expanding step. The expanding step includes radially expanding the adhesive tape 40, on which separated individual semiconductor chips are adhered, to increase distances between the individual semiconductor chips.

(I) Picking-Up Step

Figure 10:
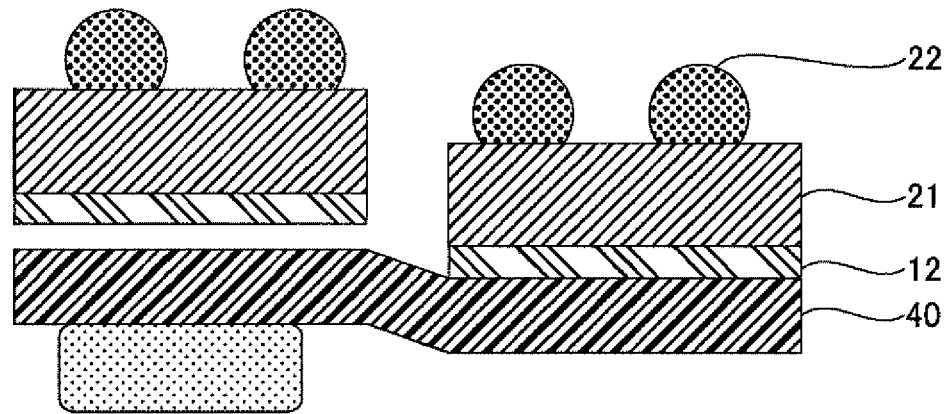
FIG. 10 is a schematic cross-sectional view illustrating a picking-up step.

FIG. 10 is a schematic cross-sectional view illustrating a picking-up step. The picking-up step includes pressing the underside surface of the adhesive tape 40 to detach the semiconductor chips secured to the adhesive tape 40 and suctioning up the detached semiconductor chips with a collet. The picked-up semiconductor chips are collected in a chip tray or conveyed to a chip-mounting nozzle of a flip-chip bonder.

(J) Mounting Step

Figure 11:
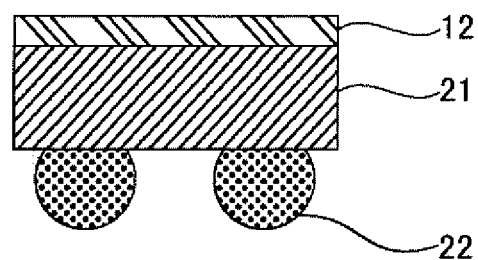
FIG. 11 is a schematic cross-sectional view illustrating a mounting step.

FIG. 11 is a schematic cross-sectional view illustrating a mounting step. The mounting step includes, for example, connecting the semiconductor chip and a circuit substrate using a circuit connecting material such as NCF (non-conductive film). Examples of the circuit substrate, without particular limitation, include plastic substrates such as polyimide substrates and glass epoxy substrates as well as ceramic substrates. Furthermore, as a connection method, known methods such as those using thermal-bonding or reflow ovens can be used.

According to such a method for manufacturing a semiconductor device, applying the thermosetting adhesive sheet to a ground surface of the semiconductor wafer reduces warping of the semiconductor wafer, which can suppress chipping and facilitate dicing.

EXAMPLES

3. Examples

Hereinafter, examples according to the present disclosure will be described. In the present examples, thermosetting adhesive sheets were prepared and applied to patterned wafers in which warping had occurred to prepare laminated bodies. Then, film-formation properties of the thermosetting adhesive sheets, suppression of chipping during dicing, and control of wafer warping were evaluated.

Thermosetting Adhesive Sheet Preparation

The components listed below were blended to prepare resin compositions. These were then applied to release-treated PET (polyethylene terephthalate) using a bar coater and then dried in an oven at 80° C. for 3 minutes to prepare thermosetting adhesive sheets having a thermosetting adhesive layer at a thickness of 20 μm (cover release-treated PET (25 μm))/thermosetting adhesive layer (20 μm)/base release-treated PET (50 μm).

A-DCP: tricyclodecane dimethanol diacrylate (SHIN-NAKAMURA CHEMICAL CO. LTD., number of functional groups per unit molecular weight (functional groups/molecular weight)=0.0065)

M-315: isocyanurate ethylene-oxide-modified diacrylate and isocyanurate ethylene-oxide-modified triacrylate (3 to 13% isocyanurate ethylene-oxide-modified diacrylate content) (TOAGOSEI CO., LTD., number of functional groups per unit molecular weight (functional groups/molecular weight)=0.007)

UN-3320HA: polyfunctional urethane acrylate oligomer (Negami Chemical Industrial Co., Ltd., number of functional groups per unit molecular weight (functional groups/molecular weight)=0.004)

VR-90: bisphenol A epoxy acrylate (Showa Highpolymer Co., Ltd., number of functional groups per unit molecular weight (functional groups/molecular weight)=0.0018)

UN-6301: aliphatic urethane acrylate oligomer (Negami Chemical Industrial Co., Ltd., number of functional groups per unit molecular weight (functional groups/molecular weight)=0.00006)

KBM-503: silane coupling agent (Shin-Etsu Chemical Co., Ltd.)

PEROYL L: dilauroyl peroxide (manufactured by NOF CORPORATION, one-minute half-life temperature: 116.4° C.).

SG-P3: elastomer (Nagase ChemteX Corporation)

Aerosil R202: silica (NIPPON AEROSIL CO., LTD)

3050B: carbon black (Mitsubishi Chemical Corporation)

Laminated Body Preparation

Thermosetting adhesive layers having a thickness of 20 μm were applied onto patterned wafers with a press and cured at 130° C. for one hour to obtain laminated bodies.

Eight-inch patterned wafers having a thickness of 200 μm were used. Furthermore, average warping of the patterned wafers (sample size: 10) was 4 mm. Warping of the patterned wafers was measured as the maximum value of the warp (z-axis) when one of the patterned wafers was placed on a planar stage (x-y plane).

Evaluation of Film-Formation Properties

The thermosetting adhesive sheet were evaluated for film properties, tackiness, and lamination properties, and those evaluated as favorable in each respect were evaluated as "PASS," those evaluated unfavorably in any of these respects being evaluated as "FAIL."

Evaluation of Chipping Suppression During Dicing

Dicing tape was laminated on the thermosetting adhesive layer side of the laminated bodies, and the laminated bodies were observed after dicing. Cases of less than 5% defects due to chipping were evaluated as "PASS," and cases of 5% or more as "FAIL."

Evaluation of Wafer Warping Control

As in measurement of warping of the patterned wafers, warping of the laminated bodies was measured as the maximum value of the warp (z-axis) when one of the laminated bodies was placed on a planar stage (x-y plane). Laminated bodies having less than 1.0 mm of warping were evaluated as "A," laminated bodies having 1.0 to 1.5 mm or less of warping were evaluated as "B," laminated bodies having 1.5 to 2.5 mm or less of warping were evaluated as "C," and laminated bodies having 2.5 mm or more of warping were evaluated as "D."

Example 1

As represented in Table 1, a resin composition was prepared having 84 pts. mass of a resin component containing 20 pts. mass of a trifunctional acrylate (M-315), 60 pts. mass of a bisphenol A epoxy acrylate (VR-90), 1 pts. mass of a coupling agent (KBM-503), and 3 pts. mass of an organic peroxide (PEROYL L), to which 100 pts. mass of an inorganic filler (Aerosil R202) was added. Blending amount of the inorganic filler was 119 pts. mass with respect to 100 pts. mass of the resin component, content of the solid (meth)acrylate in the resin component was 71 wt %, content of the (meth)acrylate in the resin component was 95 wt %, and the total value obtained by multiplying the number of functional groups per unit molecular weight of the (meth) acrylate by content of the (meth)acrylate in the resin component was 2.99E-03. Thermosetting adhesive sheets prepared using this resin composition were evaluated as PASS for film-formation properties, PASS for suppression of chipping during dicing, and A for control of thin wafer warping.

Example 2

As represented in table 1, except that 70 pts. mass of the inorganic filler (Aerosil R202) was added, a resin composition was prepared as in example 1. Blending amount of the inorganic filler was 83 pts. mass with respect to 100 pts. mass of the resin component, content of the solid (meth) acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.99E-03. Thermosetting adhesive sheets prepared using this resin composition were evaluated as PASS for film-formation properties, PASS for suppression of chipping during dicing, and A for control of thin wafer warping.

Example 3

As represented in table 1, except that 150 pts. mass of the inorganic filler (Aerosil R202) was added, a resin composition was prepared as in example 1. Blending amount of the inorganic filler was 179 pts. mass with respect to 100 pts. mass of the resin component, content of the solid (meth) acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.99E-03. Thermosetting adhesive sheets prepared using this resin composition were evaluated as PASS for film-formation properties, PASS for suppression of chipping during dicing, and A for control of thin wafer warping.

Example 4

As represented in table 1, except that 15 pts. mass of the trifunctional acrylate (M-315) and 5 pts. mass of a polyfunctional urethane acrylate oligomer (UN-3320HA) were blended, a resin composition was prepared as in example 1. Blending amount of the inorganic filler was 119 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.80E-03. Thermosetting adhesive sheets prepared using this resin composition were evaluated as PASS for film-formation properties, PASS for suppression of chipping during dicing, and A for control of thin wafer warping.

Example 5

As represented in table 1, except that 17 pts. mass of the trifunctional acrylate (M-315) and 3 pts. mass of an aliphatic urethane acrylate oligomer (UN-6301) were blended, a resin composition was prepared as in example 1. Blending amount of the inorganic filler was 119 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth) acrylate by the content of the (meth)acrylate in the resin component was 2.74E-03. Thermosetting adhesive sheets prepared using this resin composition were evaluated as PASS for film-formation properties, PASS for suppression of chipping during dicing, and B for control of thin wafer warping.

Example 6

As represented in table 1, except that 3 pts. mass of a bifunctional acrylate (A-DCP) and 17 pts. mass of the trifunctional acrylate (M-315) were blended, a resin composition was prepared as in example 1. Blending amount of the inorganic filler was 119 pts. mass with respect to 100 pts. mass of the resin component, content of the solid (meth) acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.97E-03. Thermosetting adhesive sheets prepared using this resin composition were evaluated as PASS for film-formation properties, PASS for suppression of chipping during dicing, and B for control of thin wafer warping.

Example 7

As represented in table 1, except that 5 pts. mass of carbon black was added, a resin composition was prepared as in example 1. Blending amount of the inorganic filler was 125 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.99E-03. Thermosetting adhesive sheets prepared using this resin composition were evaluated as PASS for film-formation properties, PASS for suppression of chipping during dicing, and A for control of thin wafer warping.

Example 8

As represented in table 2, except that 55 pts. mass of the bisphenol A epoxy acrylate (VR-90) and 5 pts. mass of an elastomer (SG-P3) were added, a resin composition was prepared as in example 1. Blending amount of the inorganic filler was 119 pts. mass with respect to 100 pts. mass of the resin component, content of the solid (meth)acrylate in the resin component was 65 wt %, content of (meth)acrylate in the resin component was 89 wt %, and the total value obtained by multiplying the number of functional groups per unit molecular weight of the (meth)acrylate by the content of the (meth)acrylate in the resin component was 2.88E-03. Thermosetting adhesive sheets prepared using this resin composition were evaluated as PASS for film-formation properties, PASS for suppression of chipping during dicing, and B for control of thin wafer warping.

Example 9

As represented in table 2, except that 50 pts. mass of the bisphenol A epoxy acrylate (VR-90) and 10 pts. mass of an elastomer (SG-P3) were added, a resin composition was prepared as in example 1. Blending amount of the inorganic filler was 119 pts. mass with respect to 100 pts. mass of the resin component, content of the solid (meth)acrylate in the resin component was 60 wt %, content of (meth)acrylate in the resin component was 85 wt %, and the total value obtained by multiplying the number of functional groups per unit molecular weight of the (meth)acrylate by the content of the (meth)acrylate in the resin component was 2.77E-03. Thermosetting adhesive sheets prepared using this resin composition were evaluated as PASS for film-formation properties, PASS for suppression of chipping during dicing, and B for control of thin wafer warping.

Comparative Example 1

As represented in table 2, except that 50 pts. mass of the inorganic filler was added, a resin composition was prepared as in example 1. Blending amount of the inorganic filler was 60 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.99E-03. Thermosetting adhesive sheets prepared using this resin composition were evaluated as FAIL for film-formation properties, FAIL for suppression of chipping during dicing, and D for control of thin wafer warping.

Comparative Example 2

As represented in table 2, except that 200 pts. mass of the inorganic filler was added, a resin composition was prepared as in example 1. Blending amount of the inorganic filler was 238 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.99E-03. Thermosetting adhesive sheets prepared using this resin composition were evaluated as FAIL for film-formation properties, PASS for suppression of chipping during dicing, and A for control of thin wafer warping.

Comparative Example 3

As represented in table 2, except that, instead of the trifunctional acrylate, 20 pts. mass of an aliphatic urethane acrylate oligomer (UN-6301) was blended, a resin composition was prepared as in example 1. Blending amount of the inorganic filler was 119 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 1.31E-03. Thermosetting adhesive sheets prepared using this resin composition were evaluated as PASS for film-formation properties, FAIL for suppression of chipping during dicing, and D for control of thin wafer warping.

Comparative Example 4

As represented in table 2, except that, instead of the trifunctional acrylate, 20 pts. mass of a bifunctional acrylate (A-DCP) was blended, a resin composition was prepared as in example 1. Blending amount of the inorganic filler was 119 pts. mass with respect to 100 pts. mass of the resin component, content of the solid (meth)acrylate in the resin component was 71 wt %, content of (meth)acrylate in the resin component was 95 wt %, and the total value obtained by multiplying the number of functional groups per unit molecular weight of the (meth)acrylate by the content of the (meth)acrylate in the resin component was 2.87E-03. Thermosetting adhesive sheets prepared using this resin composition were evaluated as FAIL for film-formation properties, PASS for suppression of chipping during dicing, and B for control of thin wafer warping.

Comparative Example 5

As represented in table 2, except that 45 pts. mass of the bisphenol A epoxy acrylate (VR-90) and 15 pts. mass of an elastomer (SG-P3) were blended, a resin composition was prepared as in example 1. Blending amount of the inorganic filler was 119 pts. mass with respect to 100 pts. mass of the resin component, content of the solid (meth)acrylate in the resin component was 54 wt %, content of (meth)acrylate in the resin component was 82 wt %, and the total value obtained by multiplying the number of functional groups per unit molecular weight of the (meth)acrylate by the content of the (meth)acrylate in the resin component was 2.66E-03. Thermosetting adhesive sheets prepared using this resin composition were evaluated as PASS for film-formation properties, PASS for suppression of chipping during dicing, and C for control of thin wafer warping.

Comparative Example 6

As represented in table 2, except that 40 pts. mass of the bisphenol A epoxy acrylate (VR-90) and 15 pts. mass of an elastomer (SG-P3) were blended, a resin composition was prepared as in example 1. Blending amount of the inorganic filler was 127 pts. mass with respect to 100 pts. mass of the resin component, content of the solid (meth)acrylate in the resin component was 51 wt %, content of (meth)acrylate in the resin component was 81 wt %, and the total value obtained by multiplying the number of functional groups per unit molecular weight of the (meth)acrylate by content of the (meth)acrylate in the resin component was 2.72E-03. Thermosetting adhesive sheets prepared using this resin composition were evaluated as FAIL for film-formation properties, PASS for suppression of chipping during dicing, and C for control of thin wafer warping.

TABLE 1

| Component | MW | Functionality | Trade Name | Ex. 1 | Ex. 2 | Ex. 3 | Ex. 4 | Ex. 5 | Ex. 6 | Ex. 7 |
|---|---|---|---|---|---|---|---|---|---|---|
| Bifunctional acrylate | 304 | 2 | A-DCP | — | — | — | — | — | 3 | — |
| Trifunctional acrylate | 423 | 3 | M-315 | 20 | 20 | 20 | 15 | 17 | 17 | 20 |
| Polyfunctional urethane acrylate oligomer | 1500 | 6 | UN-3320HA | — | — | — | 5 | — | — | — |
| Bisphenol A epoxy acrylate (solid) | 1100 | 2 | VR-90 | 60 | 60 | 60 | 60 | 60 | 60 | 60 |
| Aliphatic urethane acrylate oligomer | 33000 | 2 | UN-6301 | — | — | — | — | 3 | — | — |
| Coupling agent | | | KBM-503 | 1 | 1 | 1 | 1 | 1 | 1 | 1 |
| Initiator | | | PEROYL L | 3 | 3 | 3 | 3 | 3 | 3 | 3 |
| Elastomer | | | SG-P3 | — | — | — | — | — | — | — |
| Resin component [pts. mass] | | | | 84 | 84 | 84 | 84 | 84 | 84 | 84 |
| Inorganic filler | | | Aerosil R202 | 100 | 70 | 150 | 100 | 100 | 100 | 100 |
| Carbon black | | | #3050B | — | — | — | — | — | — | 5 |
| Filler blending amount to 100 pts. mass resin component [pts. mass] | | | | 119 | 83 | 179 | 119 | 119 | 119 | 125 |
| Epoxy (meth)acrylate content of resin component [wt %] | | | | 71 | 71 | 71 | 71 | 71 | 71 | 71 |
| (Meth)acrylate content of resin component [wt %] | | | | 95 | 95 | 95 | 95 | 95 | 95 | 95 |
| Avg. crosslink density per 100 pts. mass resin component of (meth)acrylate | | | | 2.99E-03 | 2.99E-03 | 2.99E-03 | 2.80E-03 | 2.74E-03 | 2.97E-03 | 2.99E-03 |
| Film formation properties evaluation | | | | PASS | PASS | PASS | PASS | PASS | PASS | PASS |
| Chipping suppression during dicing evaluation | | | | PASS | PASS | PASS | PASS | PASS | PASS | PASS |
| Thin wafer warping control evaluation | | | | A | A | A | A | B | B | A |

TABLE 2

| Component | MW | Functionality | Trade name | Ex. 8 | Ex. 9 | Comp. 1 | Comp. 2 |
|---|---|---|---|---|---|---|---|
| Bifunctional acrylate | 304 | 2 | A-DCP | — | — | — | — |
| Trifunctional acrylate | 423 | 3 | M-315 | 20 | 20 | 20 | 20 |
| Polyfunctional urethane acrylate oligomer | 1500 | 6 | UN-3320HA | — | — | — | — |
| Bisphenol A epoxy acrylate (solid) | 1100 | 2 | VR-90 | 55 | 50 | 60 | 60 |
| Aliphatic urethane acrylate oligomer | 33000 | 2 | UN-6301 | — | — | — | — |
| Coupling agent | | | KBM-503 | 1 | 1 | 1 | 1 |
| Initiator | | | PEROYL L | 3 | 3 | 3 | 3 |
| Elastomer | | | SG-P3 | 5 | 10 | — | — |
| Resin component [pts. mass] | | | | 84 | 84 | 84 | 84 |
| Inorganic filler | | | Aerosil R202 | 100 | 100 | 50 | 200 |
| Carbon black | | | #3050B | — | — | — | — |
| Filler blending amount to 100 pts. mass resin component [pts. mass] | | | | 119 | 119 | 60 | 238 |
| Epoxy (meth)acrylate content of resin component [wt %] | | | | 65 | 60 | 71 | 71 |
| (Meth)acrylate content of resin component [wt %] | | | | 89 | 85 | 95 | 95 |
| Avg. crosslink density per 100 pts. mass resin component of (meth)acrylate | | | | 2.88E-03 | 2.77E-03 | 2.99E-03 | 2.99E-03 |
| Film formation properties evaluation | | | | PASS | PASS | FAIL | FAIL |
| Chipping suppression during dicing evaluation | | | | PASS | PASS | FAIL | PASS |
| Thin wafer warping control evaluation | | | | B | B | D | A |

| Component | MW | Functionality | Trade name | Comp. 3 | Comp. 4 | Comp. 5 | Comp. 6 |
|---|---|---|---|---|---|---|---|
| Bifunctional acrylate | 304 | 2 | A-DCP | — | 20 | — | — |
| Trifunctional acrylate | 423 | 3 | M-315 | — | — | 20 | 20 |
| Polyfunctional urethane acrylate oligomer | 1500 | 6 | UN-3320HA | — | — | — | — |
| Bisphenol A epoxy acrylate (solid) | 1100 | 2 | VR-90 | 60 | 60 | 45 | 40 |
| Aliphatic urethane acrylate oligomer | 33000 | 2 | UN-6301 | 20 | — | — | — |
| Coupling agent | | | KBM-503 | 1 | 1 | 1 | 1 |
| Initiator | | | PEROYL L | 3 | 3 | 3 | 3 |
| Elastomer | | | SG-P3 | — | — | 15 | 15 |
| Resin component [pts. mass] | | | | 84 | 84 | 84 | 79 |
| Inorganic filler | | | Aerosil R202 | 100 | 100 | 100 | 100 |
| Carbon black | | | #3050B | — | — | — | — |
| Filler blending amount to 100 pts. mass resin component [pts. mass] | | | | 119 | 119 | 119 | 127 |
| Epoxy (meth)acrylate content of resin component [wt %] | | | | 71 | 71 | 54 | 51 |
| (Meth)acrylate content of resin component [wt %] | | | | 95 | 95 | 82 | 81 |
| Avg. crosslink density per 100 pts. mass resin component of (meth)acrylate | | | | 1.31E-03 | 2.87E-03 | 2.66E-03 | 2.72E-03 |
| Film formation properties evaluation | | | | PASS | FAIL | PASS | FAIL |
| Chipping suppression during dicing evaluation | | | | FAIL | PASS | PASS | PASS |
| Thin wafer warping control evaluation | | | | D | B | C | C |

As in Comparative Example 1, insufficient filler caused inferior tackiness and lamination, high defect rates, and inability to significantly control wafer warping. As in Comparative Example 2, excessive filler caused inferior tackiness and lamination properties. Furthermore, as in Comparative Example 3, when a total value obtained by multiplying the number of functional groups per unit molecular weight of the (meth)acrylate by content of the (meth)acrylate in the resin component was less than 2.7E-03, high defect rates occurred when dicing, and wafer warping could not be significantly reduced. Moreover, as in Comparative Example 4, not blending the trifunctional or higher functional (meth)acrylate caused inferior tackiness and lamination properties. Still further, as in Comparative Examples 5 and 6, wafer warping could not be significantly reduced with insufficient content of the solid (meth)acrylate in the resin component due to inadequate contraction.

In contrast, as in Examples 1 to 9, when containing a filler and resin component containing a (meth)acrylate and a polymerization initiator, the (meth)acrylate containing a solid (meth)acrylate and a trifunctional or higher functional (meth)acrylate, content of the solid (meth)acrylate in the resin component being 55 wt % or more, a total value obtained by multiplying the number of functional groups per unit molecular weight of the (meth)acrylate by content of the (meth)acrylate in the resin component being 2.7E-03 or more, and blending amount of the filler being 80 to 220 pts. mass with respect to 100 pts. mass of the resin component, film-formation properties were excellent, defect rates when dicing were low, and significant reductions in wafer warping were achieved.

Furthermore, from Examples 1 to 7, it can be seen that contents of the (meth)acrylate in the resin component of 90 wt % or more can significantly reduce wafer warping.

REFERENCE SIGNS LIST

11 matrix film layer, 12 thermosetting adhesive layer, 21 wafer, 22 protruding electrode, 30 protective tape, 31 thermoplastic resin layer, 32 matrix film layer

The invention claimed is:

1. A thermosetting adhesive sheet comprising:
   a thermosetting adhesive layer formed from a resin composition containing a resin component and a filler, the resin component containing a (meth)acrylate and a polymerization initiator,
   wherein the (meth)acrylate contains a solid (meth)acrylate and a trifunctional or higher functional (meth)acrylate,
   wherein content of the solid (meth)acrylate in the resin component is 55 wt % or more,
   wherein a total value obtained by multiplying the number of functional groups per unit molecular weight of the (meth)acrylate by content of the (meth)acrylate in the resin component is 2.7E-03 or more, and
   wherein blending amount of the filler is 80 to 220 pts. mass with respect to 100 pts. mass of the resin component.

2. The thermosetting adhesive sheet according to claim 1, wherein weight average molecular weight of the (meth)acrylate is 200 to 50,000.

3. The thermosetting adhesive sheet according to claim 2, wherein the solid (meth)acrylate comprises a bisphenol epoxy (meth)acrylate.

4. The thermosetting adhesive sheet according to claim 2, wherein content of the (meth)acrylate in the resin component is 90 wt % or more.

5. The thermosetting adhesive sheet according to claim 2, wherein the filler includes a black pigment.

6. The thermosetting adhesive sheet according to claim 1, wherein the solid (meth)acrylate comprises a bisphenol epoxy (meth)acrylate.

7. The thermosetting adhesive sheet according to claim 6, wherein content of the (meth)acrylate in the resin component is 90 wt % or more.

8. The thermosetting adhesive sheet according to claim 6, wherein the filler includes a black pigment.

9. The thermosetting adhesive sheet according to claim 1, wherein content of the (meth)acrylate in the resin component is 90 wt % or more.

10. The thermosetting adhesive sheet according to claim 9, wherein the filler includes a black pigment.

11. The thermosetting adhesive sheet according to claim 1, wherein the filler includes a black pigment.

12. A method for manufacturing a semiconductor device comprising:
   a grinding step of grinding a semiconductor wafer;
   a thermosetting adhesive sheet applying step of applying a thermosetting adhesive sheet to a ground surface of the semiconductor wafer;
   a curing step of curing the thermosetting adhesive sheet to reduce warping of the semiconductor wafer;
   a dicing tape applying step of applying a dicing tape to a side of the semiconductor wafer to which the thermosetting adhesive sheet is applied; and
   a dicing step of dicing the semiconductor wafer to which the dicing tape is applied to obtain individual semiconductor chips,
   wherein the thermosetting adhesive sheet comprises a thermosetting adhesive layer formed from a resin composition containing a resin component and a filler, the resin component containing a (meth)acrylate and a polymerization initiator,
   wherein the (meth)acrylate contains a solid (meth)acrylate and a trifunctional or higher functional (meth)acrylate,
   wherein content of the solid (meth)acrylate in the resin component is 55 wt % or more,
   wherein a total value obtained by multiplying the number of functional groups per unit molecular weight of the (meth)acrylate by content of the (meth)acrylate in the resin component is 2.7E-03 or more, and
   wherein blending amount of the filler is 80 to 220 pts. mass with respect to 100 pts. mass of the resin component.

13. The method for manufacturing a semiconductor device according to claim 12, wherein the grinding step includes grinding to a thickness of 200 μm or less.

* * * * *